(12) United States Patent
Li et al.

(10) Patent No.: US 9,620,418 B2
(45) Date of Patent: Apr. 11, 2017

(54) METHODS FOR FABRICATING INTEGRATED CIRCUITS WITH IMPROVED ACTIVE REGIONS

(71) Applicant: GLOBALFOUNDRIES Singapore Pte. Ltd.

(72) Inventors: Liang Li, Singapore (SG); Wei Lu, Singapore (SG); Lian Choo Goh, Singapore (SG); Yung Fu Alfred Chong, Singapore (SG); Fangyue Liu, Singapore (SG); Alex See, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/538,850

(22) Filed: Nov. 12, 2014

(65) Prior Publication Data

US 2016/0133524 A1    May 12, 2016

(51) Int. Cl.
| | |
|---|---|
| *H01L 21/8234* | (2006.01) |
| *H01L 21/02* | (2006.01) |
| *H01L 21/265* | (2006.01) |
| *H01L 21/266* | (2006.01) |
| *H01L 21/311* | (2006.01) |

(52) U.S. Cl.
CPC .... *H01L 21/823462* (2013.01); *H01L 21/266* (2013.01); *H01L 21/26513* (2013.01); *H01L 21/823418* (2013.01); *H01L 21/823481* (2013.01); *H01L 21/823493* (2013.01)

(58) Field of Classification Search
CPC ..... H01L 21/823412; H01L 21/823462; H01L 21/823481; H01L 21/0206; H01L 21/02068; H01L 21/823878; H01L 21/76235
See application file for complete search history.

(56) References Cited

U.S. PATENT DOCUMENTS

| | | | | |
|---|---|---|---|---|
| 2004/0266118 | A1* | 12/2004 | Han | ................. H01L 21/28123 438/294 |
| 2006/0214212 | A1* | 9/2006 | Horita | ................. H01L 27/0207 257/300 |
| 2011/0042730 | A1* | 2/2011 | Tajiri | ................ H01L 21/76224 257/288 |
| 2011/0269293 | A1* | 11/2011 | Kronholz | .......... H01L 21/28123 438/421 |

* cited by examiner

*Primary Examiner* — Jerome Jackson, Jr.
*Assistant Examiner* — David Spalla
(74) *Attorney, Agent, or Firm* — Lorenz & Kopf, LLP

(57) ABSTRACT

Methods for fabricating integrated circuits having improved active regions are provided. In an embodiment, a method for fabricating an integrated circuit includes providing a semiconductor substrate having an upper surface and including active regions and isolation regions formed in a low voltage device area and in a high voltage device area. The method includes selectively forming voids between the isolation regions and the active regions in the high voltage device area to expose active side surfaces. The method further includes oxidizing the upper surface and the active side surfaces to form a gate oxide layer over the low voltage device area and the high voltage device area.

17 Claims, 8 Drawing Sheets

METHODS FOR FABRICATING INTEGRATED CIRCUITS WITH IMPROVED ACTIVE REGIONS

TECHNICAL FIELD

The present disclosure generally relates to methods for fabricating integrated circuits, and more particularly relates to methods for fabricating integrated circuits with improved active regions.

BACKGROUND

In many instances, devices having different gate oxide layer thicknesses need to be integrated on the same semiconductor substrate. For example, thicker gate oxide devices may be formed on the periphery of the semiconductor substrate so that they can handle higher voltages associated with input/output operations. Thinner gate oxide devices may be formed in areas of the substrate where low voltage devices are located.

Formation of thinner gate oxide layers and thicker gate oxide layers is possible through different gate oxide processing of the semiconductor substrate. However, the different gate oxide processing may cause different physical and electrical effects across the low voltage device areas, medium voltage device areas, and high voltage device areas in the semiconductor substrate, such as formation of sharp corners or horns in active material underlying gate oxide layers.

Specifically, it has been found that use of a dual gate oxidation (DGO) process to form gate oxide in medium and/or high voltage device areas of a semiconductor often results in the formation of sharp corners in the underlying active material. Such sharp corners harm device performance. Yet the thinner gate oxide formation process performed in low voltage device areas, such as a single gate (SG) process, typically do not result in sharp corners in the underlying active material.

Accordingly, it is desirable to provide methods for fabricating integrated circuits having improved active regions. Also, it is desirable to provide methods for fabricating integrated circuits with well-formed active regions in both low voltage device areas and in medium and/or high voltage device areas. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits having improved active regions are provided. In an embodiment, a method for fabricating an integrated circuit includes providing a semiconductor substrate having an upper surface and including active regions and isolation regions formed in a low voltage device area and in a high voltage device area. The method includes selectively forming voids between the isolation regions and the active regions in the high voltage device area to expose active side surfaces. The method further includes oxidizing the upper surface and the active side surfaces to form a gate oxide layer over the low voltage device area and the high voltage device area.

In another embodiment, a method for fabricating an integrated circuit includes providing a semiconductor substrate with a high voltage device area, active regions, and an upper surface. The method exposes side surfaces of the active regions in the high voltage device area. The method further includes oxidizing the upper surfaces and the side surfaces of the active regions in the high voltage device area to form oxidized material and to define convex interfaces between the oxidized material and underlying active material in the active regions in the high voltage device area.

In accordance with another embodiment, a method for fabricating an integrated circuit includes providing a semiconductor substrate with a thin gate dielectric device area and a thick gate dielectric device area, and with active regions and isolation regions. The method includes selectively etching the isolation regions in the thick gate dielectric device area to form voids therein. Further, the method includes forming a gate dielectric layer over the active regions and defining convex interfaces between the gate dielectric layer and underlying active material in the active regions in the thick gate dielectric device area.

BRIEF DESCRIPTION OF THE DRAWINGS

Embodiments of methods for fabricating integrated circuits will hereinafter be described in conjunction with the following drawing figures, wherein like numerals denote like elements, and wherein.

DETAILED DESCRIPTION

The following detailed description is merely exemplary in nature and is not intended to limit the methods for fabricating integrated circuits as claimed herein. Furthermore, there is no intention to be bound by any expressed or implied theory presented in the preceding technical field, background or brief summary, or in the following detailed description.

In accordance with various embodiments herein, methods for fabricating integrated circuits having improved active areas in medium voltage device areas and high voltage device areas are provided. As disclosed herein, problems with conventionally formed integrated circuits may be avoided. Specifically, the methods described herein form gate dielectric layers overlying active areas without forming sharp corners in the active areas. Further, the methods described herein selectively process medium voltage device areas and high voltage device areas while processing low voltage device areas differently to form such gate dielectric layers overlying active areas. Specifically, gate dielectric formation processes are different for low voltage device areas and medium and high voltage device areas. In exemplary embodiments, gate oxide is formed in low voltage device area using a single gate (SG) process. Such a process does not typically result in formation of a sharp corner in the underlying active material. In exemplary embodiments, gate oxide is formed in medium and/or high voltage device areas by a dual gate oxidation (DGO) process. Such process is susceptible to formation of sharp corners in underlying active material. Thus, the processes for preventing formation of sharp corners in medium and/or high voltage device areas need not be performed on low voltage device areas.

The figures illustrate steps in accordance with various embodiments of methods for fabricating integrated circuits. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
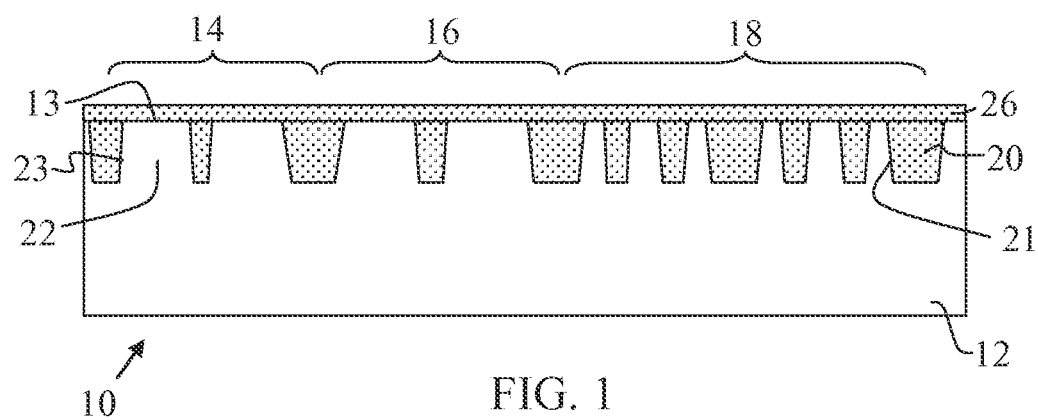
FIGS. 1-2 illustrate, in cross section, a low voltage device area, medium voltage device area and high voltage device area of an integrated circuit and method steps for fabricating an integrated circuit in accordance with embodiments herein.
Figure 2:
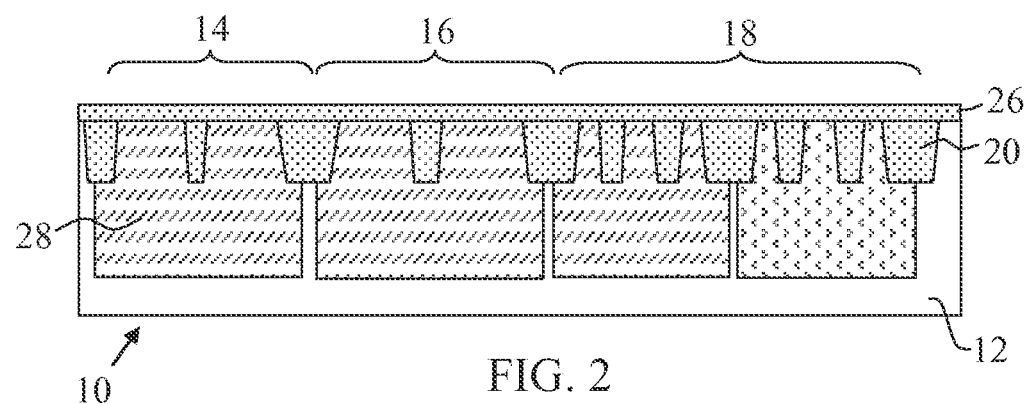

FIGS. 1-2 illustrate an initial stage of fabricating an integrated circuit. In FIG. 1, an exemplary embodiment of a method for fabricating an integrated circuit 10 includes providing a semiconductor substrate 12 having an upper surface 13. The semiconductor substrate 12 may be bulk semiconductor material, such as silicon, or a semiconductor on insulator (SOI) wafer. A semiconductor on insulator wafer includes a semiconductor material layer, such as silicon, overlying an insulator layer, such as a silicon oxide layer. While an exemplary semiconductor substrate 12 is a silicon material, the semiconductor substrate 12 may encompass the relatively pure silicon materials typically used in the semiconductor industry as well as silicon admixed with other elements. Alternatively, the semiconductor material can be realized as germanium, gallium arsenide, and the like, or the semiconductor substrate 12 can include layers of different semiconductor materials.

The semiconductor substrate 12 includes a low voltage device area 14 where low voltage devices will be formed; a medium voltage device area 16 where medium voltage devices will be formed; and a high voltage device area 18 where high voltage devices will be formed. In an exemplary embodiment, low voltage devices may operate with a voltage of from about 1 to about 1.5 V, such as about 1.2 V, medium voltage devices may operate with a voltage of from about 5 to about 8 V, such as about 6.0 V, and high voltage devices may operate with a voltage of about 15 to about 40 V, such as about 32 V. Generally, low voltages operate at a lower voltage than medium voltage devices, while medium voltage devices operate at a lower voltage than high voltage devices. The low voltage device area 14 can be considered a thin gate dielectric device area, as the low voltage devices will be formed with thin gate dielectric layers. Likewise, the medium and high voltage device areas 16 and 18 may be considered thick gate dielectric device areas, as the medium and high voltage device will be formed with thick gate dielectric layers. "Thin" and "thick" are not limited to any particular thickness but instead refer to the relative thickness of the dielectric layers in area 14 as compared to areas 16 and 18.

As shown, isolation regions 20 are formed in the semiconductor substrate 12. The isolation regions 20 may be formed according to conventional processing. The isolation regions 20 are formed with sidewalls 21. The portions of the semiconductor substrate 12 between isolation regions 20 are active regions 22. As shown, the active regions 22 have side surfaces 23 in contact with the sidewalls 21 of the isolation regions 20. Active regions 22 will be appropriately doped as described below for the formation of the desired devices.

In FIG. 1, a sacrificial layer 26 is deposited over the surface 13 of the semiconductor substrate 12. An exemplary sacrificial layer 26 is silicon oxide, such as silicon oxide deposited by a low pressure tetraethyl orthosilicate (LP-TEOS) process. However, any material suitable for protecting the semiconductor substrate 12 during well implantation processing may be used. In an exemplary embodiment, the sacrificial layer 26 is formed with a thickness of about 100 to about 300 Angstroms (Å), such as about 200 Å.

In FIG. 2, well implants 28 are selectively formed in the semiconductor substrate 12. Specifically, various masking, patterning, and implantation steps are performed to dope the low voltage device area 14, medium voltage device area 16, and high voltage device area 18 as desired.

As described in FIGS. 1-2, the partially fabricated integrated circuit 10 is prepared for further processing to form active regions with an overlying gate oxide layer in the low voltage device area 14, medium voltage device area 16, and high voltage device area 18. FIGS. 3-11 illustrate method steps for fabricating an integrated circuit in accordance with an embodiment herein. The embodiment of FIGS. 3-11 utilizes sequential masking and etching of first and second regions in the medium and high voltage device areas.

Figure 3:
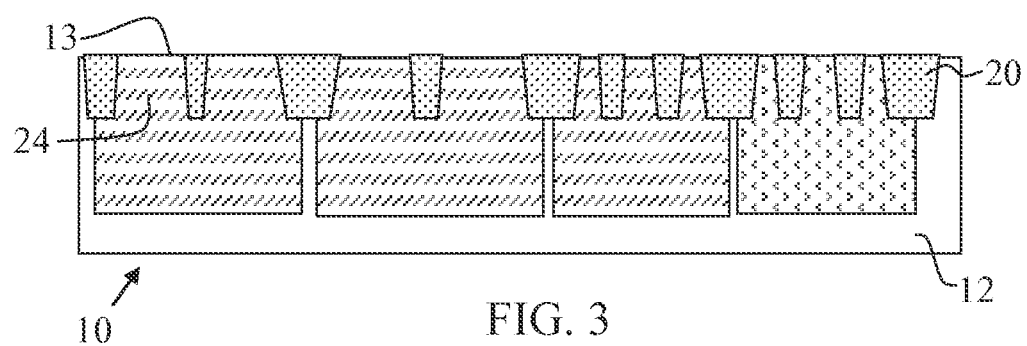
FIGS. 3-11 illustrate, in cross section, the low voltage device area, medium voltage device area and high voltage device area of the integrated circuit of FIGS. 1-2 and method steps for fabricating an integrated circuit in accordance with an embodiment herein.
Figure 4:
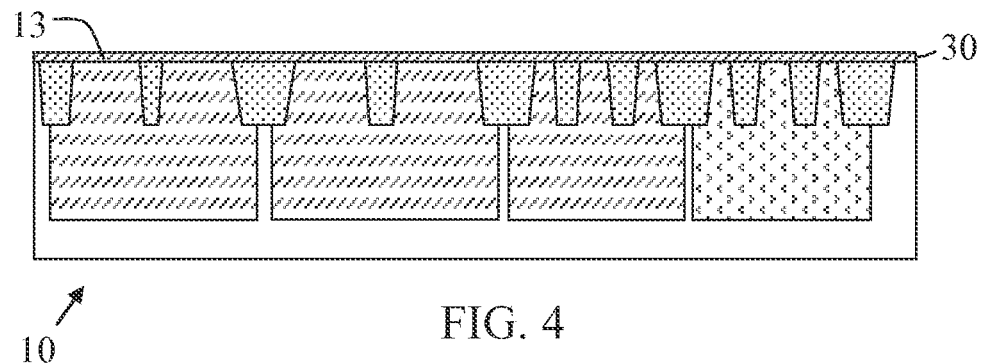

In FIG. 3, the sacrificial layer 26 is removed to expose the upper surface 13 of semiconductor substrate 12. FIG. 4 illustrates the deposition of a sacrificial layer 30 over the surface 13 of the semiconductor substrate 12. An exemplary sacrificial layer 30 is silicon oxide. An exemplary sacrificial layer 30 has a thickness of about 20 to about 60 Å, such as about 40 Å. In an exemplary embodiment, the sacrificial layer 30 is deposited by In-Situ Steam Generation (ISSG). While an exemplary sacrificial layer 30 is described, any material suitable for protecting the semiconductor substrate during active region doping, and for providing desired selective etching as described below may be used.

Figure 5:
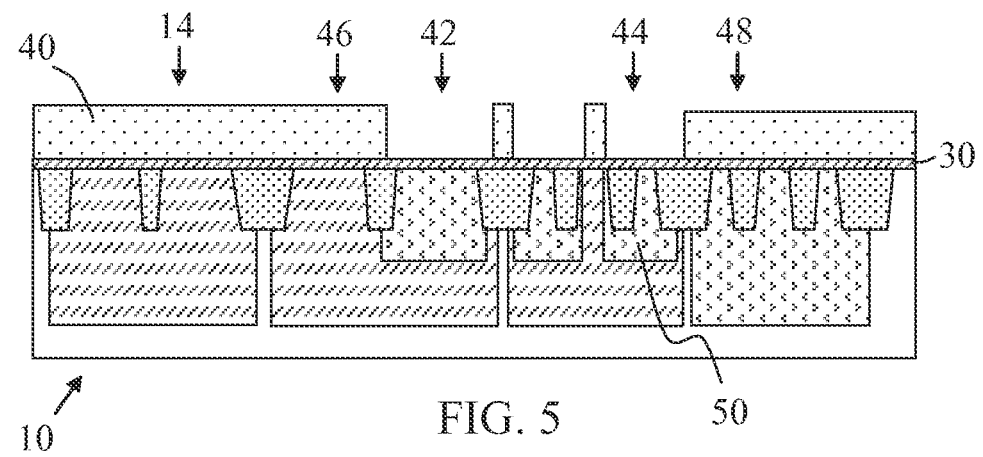

In FIG. 5, a mask 40 is formed and patterned over the semiconductor substrate 12. As shown, the mask 40 covers the low voltage device area 14. Further, the mask 40 selectively exposes unmasked region 42 in the medium voltage device area and unmasked region 44 in the high voltage device area. The mask 40 also selectively covers masked region 46 in the medium voltage device area and masked region 48 in the high voltage device area. As shown, an implantation process or processes is performed to form doped regions 50 in the unmasked regions 42, 44.

Figure 6:
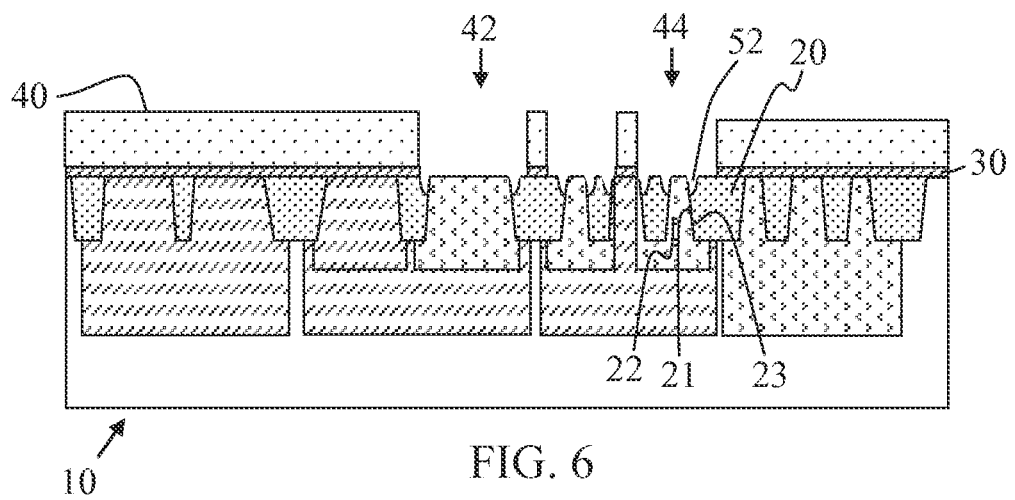

As shown in FIG. 6, an etch process is performed after the implantation process. An exemplary etch process utilizes dilute hydrofluoric acid (DHF). The etch process removes the sacrificial layer 30 in the unmasked regions 42 and 44. Further, the etch process etches voids 52 into the isolation regions 20 in the unmasked regions 42 and 44. Specifically, the etch process etches the isolation regions 20 along the upper surface and along the sidewalls 21, forming voids 52 between the sidewalls 21 and the side surfaces 23 of the active regions 22 in the unmasked regions 42, 44. The voids 52 are described in more detail in relation to FIGS. 21-23 below.

After forming voids 52, the mask 40 may be removed. In an exemplary embodiment, the mask 40 is removed by a sulfuric acid and hydrogen peroxide mixture (SPM). The exemplary embodiment continues with formation of a cap screen oxide over the semiconductor substrate 12. The cap screen oxide may be used to prevent silicon pitting during a subsequent residue clean process using Standard Clean 1 (SC1) to remove any residue from partially fabricated integrated circuit 10.

Figure 7:
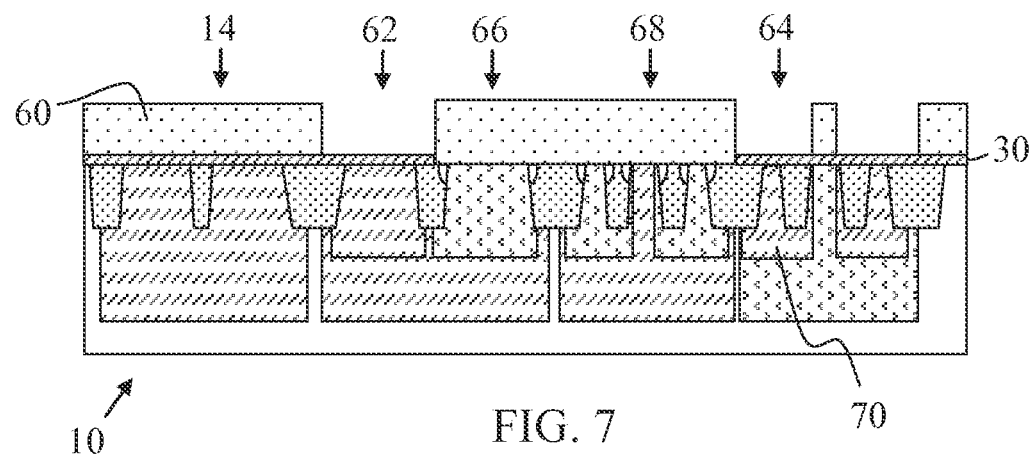

After the residue clean process, a mask 60 is formed and patterned over the semiconductor substrate 12 in FIG. 7. As shown, the mask 60 covers the low voltage device area 14. Further, the mask 60 selectively exposes unmasked region 62 in the medium voltage device area and unmasked region 64 in the high voltage device area. The mask 60 also selectively covers masked region 66 in the medium voltage device area and masked region 68 in the high voltage device area. As shown, an implantation process or processes is performed to form doped regions 70 in the unmasked regions 62, 64.

Figure 8:
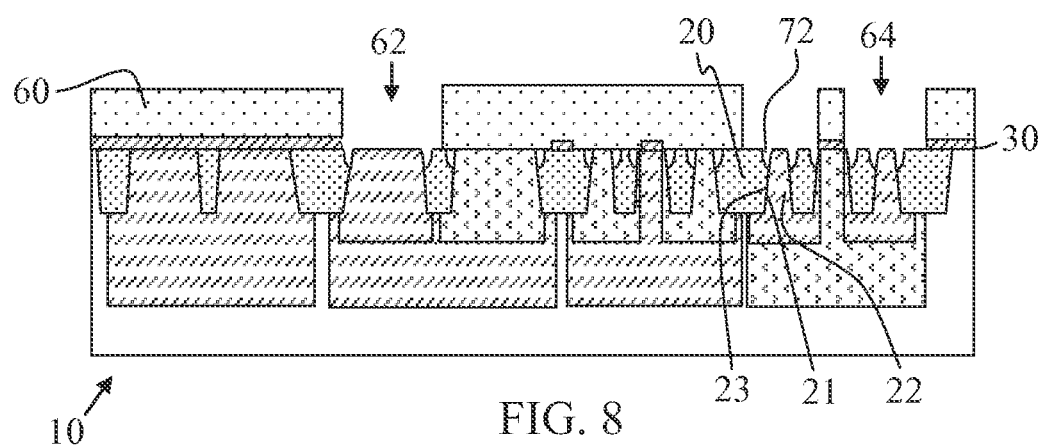

In FIG. 8, an etch process is performed after the implantation process. An exemplary etch process utilizes dilute hydrofluoric acid (DHF). The etch process removes the sacrificial layer 30 in the unmasked regions 62 and 64. Further, the etch process etches voids 72 into the isolation regions 20 in the unmasked regions 62 and 64. Specifically, the etch process etches the isolation regions 20 along the upper surface and along the sidewalls 21, forming voids 72 between the sidewalls 21 and the side surfaces 23 of the active regions 22 in the unmasked regions 62, 64. The voids 72 are described in more detail in relation to FIGS. 21-23 below.

After forming voids 72, mask 60 may be removed. In an exemplary embodiment, the mask 60 is removed by a sulfuric acid and hydrogen peroxide mixture (SPM). The exemplary embodiment continues with formation of a cap screen oxide over the semiconductor substrate 12. The cap screen oxide may be used to prevent silicon pitting during a subsequent residue clean process using Standard Clean 1 (SC1) to remove any residue from partially fabricated integrated circuit 10.

Figure 9:
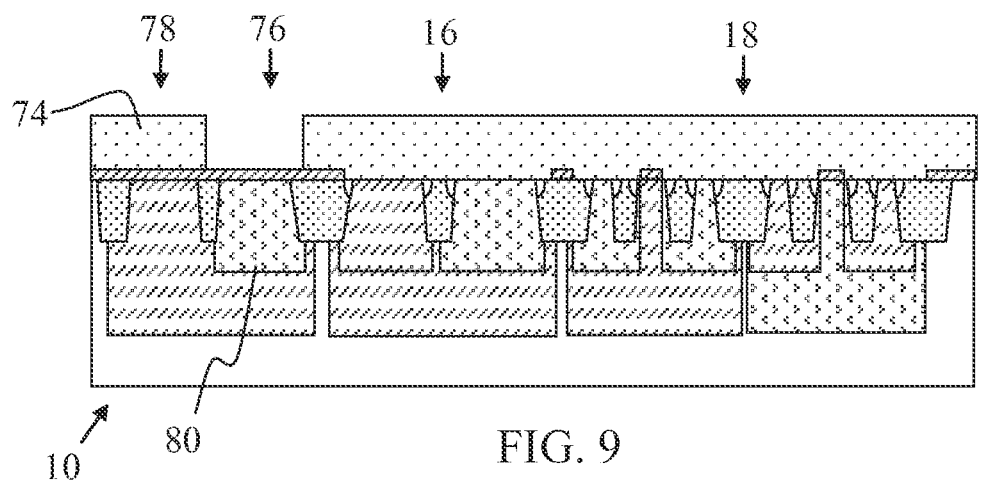

After the residue clean process, a mask 74 is formed and patterned over the semiconductor substrate 12, as shown in FIG. 9. As shown, the mask 74 covers the medium voltage device area 16 and the high voltage device area 18. Further, the mask 74 selectively exposes unmasked region 76 in the low voltage device area. The mask 74 also selectively covers masked region 78 in the low voltage device area. As shown, an implantation process or processes is performed to form doped region 80 in the unmasked region 76.

Figure 10:
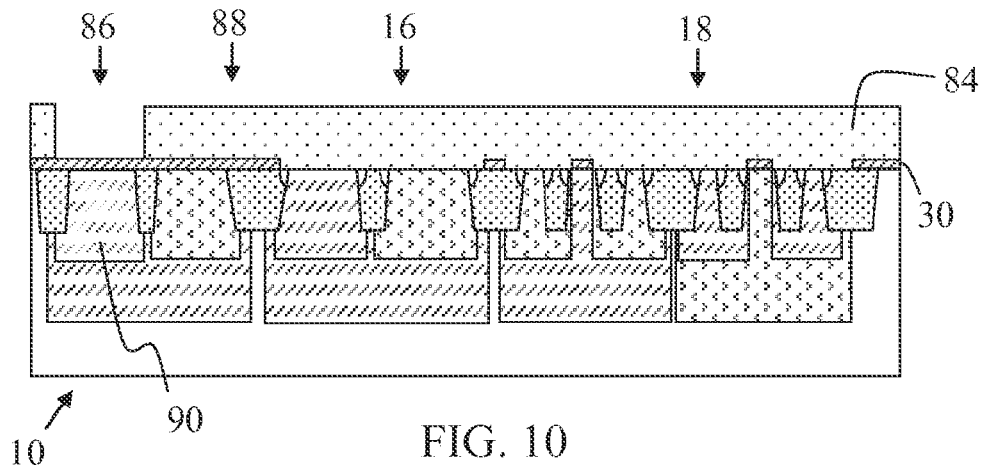

In FIG. 10, mask 74 is removed and mask 84 is formed and patterned over the semiconductor substrate 12. As shown, the mask 84 covers the medium voltage device area 16 and the high voltage device area 18. Further, the mask 84 selectively exposes unmasked region 86 in the low voltage device area. The mask 84 also selectively covers masked region 88 in the low voltage device area. As shown, an implantation process or processes is performed to form doped region 90 in the unmasked region 86.

Figure 11:
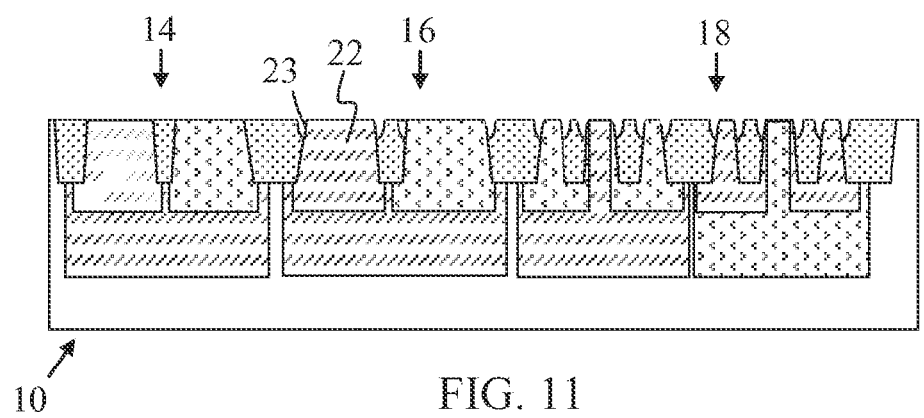

Mask 84 is removed in FIG. 11. Further, remaining portions of the sacrificial layer 30 are removed. As a result, the partially fabricated integrated circuit 10 is provided with active regions 22 having exposed side surfaces 23 in the medium voltage device area 16 and the high voltage device area 18. Further processing of the partially fabricated integrated circuit 10 is described in FIGS. 21-23 below.

FIGS. 12-17 illustrate another embodiment for forming active regions 22 having exposed side surfaces 23 in the medium voltage device area 16 and the high voltage device area 18 of the integrated circuit 10. FIGS. 12-17 process the partially fabricated integrated circuit 10 of FIG. 2.

Figure 12:
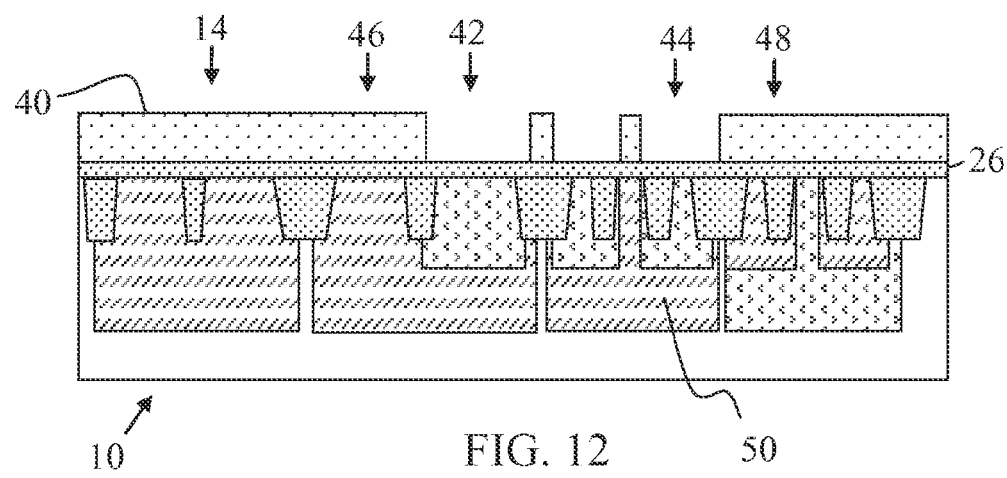
FIGS. 12-17 illustrate, in cross section, the low voltage device area, medium voltage device area and high voltage device area of the integrated circuit of FIGS. 1-2 and method steps for fabricating an integrated circuit in accordance with another embodiment herein.

Cross-referencing FIG. 12 with FIGS. 2-3, it is noted that the sacrificial layer 26 is not removed before the masking process for forming doped regions in the embodiment of FIGS. 12-17. Specifically, mask 40 is formed and patterned over sacrificial layer 26 overlying the semiconductor substrate 12. As shown, the mask 40 covers the low voltage device area 14. Further, the mask 40 selectively exposes unmasked region 42 in the medium voltage device area and unmasked region 44 in the high voltage device area. The mask 40 also selectively covers masked region 46 in the medium voltage device area and masked region 48 in the high voltage device area. As shown, an implantation process or processes is performed to form doped regions 50 in the unmasked regions 42, 44. The implantation process or processes of FIG. 12 may use an energy and/or dose different from the implantation process or processes of FIG. 5 to compensate for the differing thicknesses of sacrificial layer 26 in FIG. 12 and sacrificial layer 30 in FIG. 5.

Figure 13:
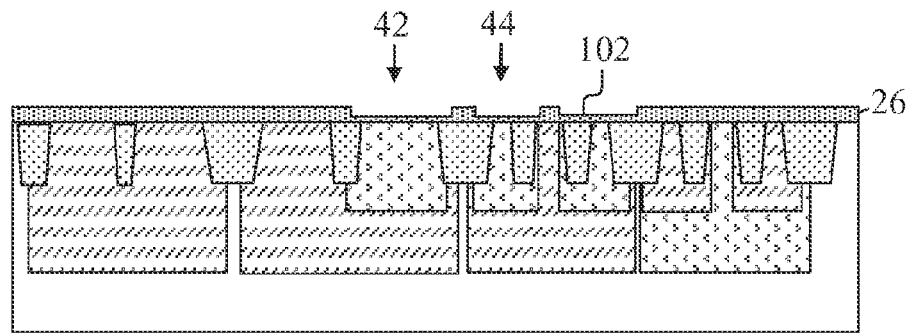

In FIG. 13, an etch process is performed and etches into, but not through, the sacrificial layer 26 in the unmasked regions 42 and 44 to form recessed sacrificial layer portions 102. Exemplary recessed sacrificial layer portions 102 have a thickness of about 20 Å to about 50 Å. In an exemplary embodiment, the etch process uses hydrofluoric acid (HF). After the implantation and etch processes, mask 40 is removed. In an exemplary embodiment, mask 40 is photoresist and is removed by a sulfuric acid and hydrogen peroxide mixture (SPM). The cap screen oxide is not needed in this embodiment, as the sacrificial layer 26 remains intact over the semiconductor substrate 12.

Figure 14:
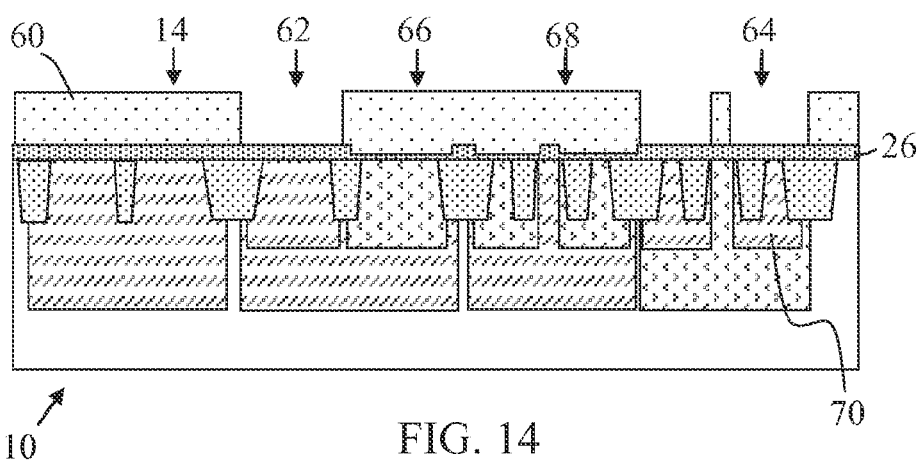

Mask 60 is formed and patterned over sacrificial layer 26 overlying the semiconductor substrate 12 in FIG. 14. As shown, the mask 60 covers the low voltage device area 14. Further, the mask 60 selectively exposes unmasked region 62 in the medium voltage device area and unmasked region 64 in the high voltage device area. The mask 60 also selectively covers masked region 66 in the medium voltage device area and masked region 68 in the high voltage device area. As shown, an implantation process or processes is performed to form doped regions 70 in the unmasked regions 62, 64. The implantation process or processes of FIG. 14 may use an energy and/or dose different from the implantation process or processes of FIG. 7 to compensate for the differing thicknesses of sacrificial layer 26 in FIG. 12 and sacrificial layer 30 in FIG. 7.

Figure 15:
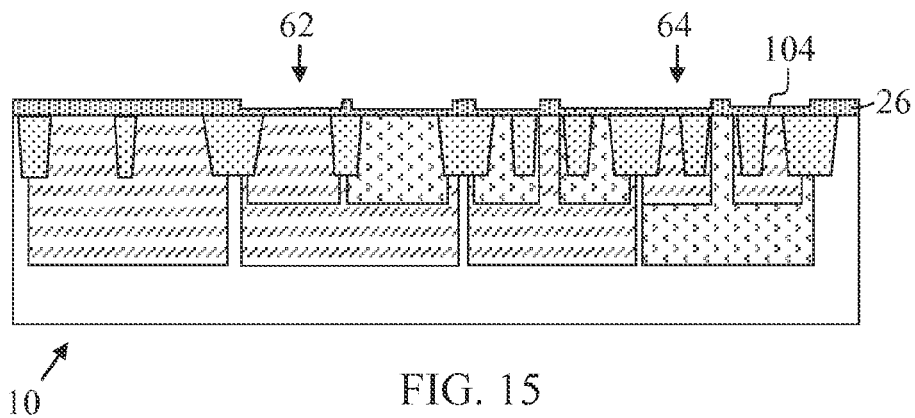

In FIG. 15, an etch process is performed and etches into, but not through, the sacrificial layer 26 in the unmasked regions 62 and 64 to form recessed sacrificial layer portions 104. Exemplary recessed sacrificial layer portions 104 have a thickness of about 20 Å to about 50 Å. In an exemplary embodiment, the etch process uses hydrofluoric acid (HF). Thereafter, mask 60 is removed. In an exemplary embodiment, mask 60 is photoresist and is removed by a sulfuric acid and hydrogen peroxide mixture (SPM). A clean process using Standard Clean 1 (SC1) may then be used to remove any residue from partially fabricated integrated circuit 10. Because the sacrificial layer 26 remains overlying the semiconductor substrate 12, the cap screen oxide process used in the first embodiment to prevent silicon pitting during the clean process is not needed.

Figure 16:
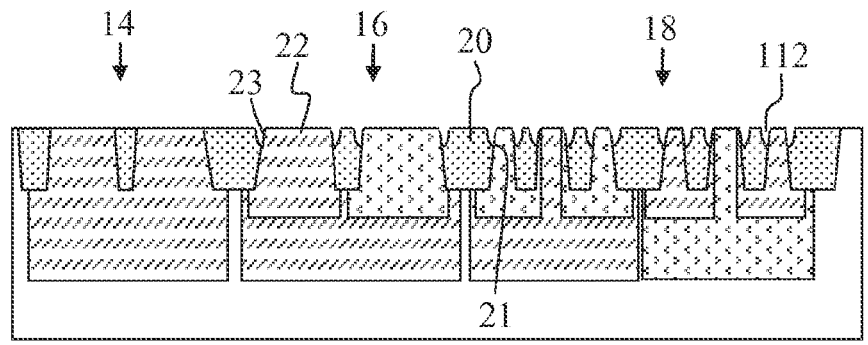
Figure 17:
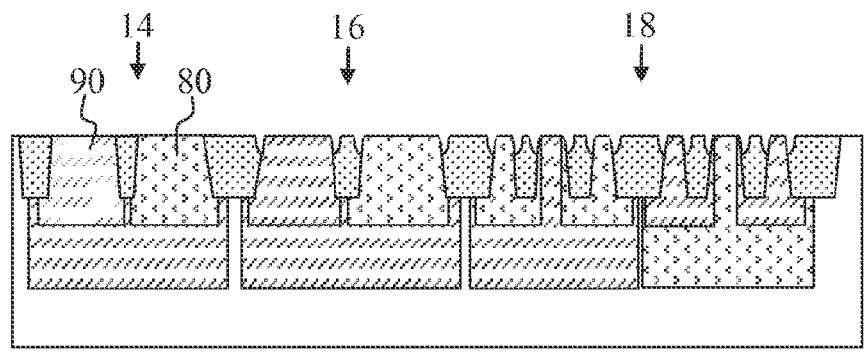

In FIG. 16, an etch process is used to remove the sacrificial layer 26. As shown, the etch process etches into the isolation regions 20 underlying the recessed portions 102 and 104 of the sacrificial layer 26, i.e., the isolation regions 20 in the medium voltage device area 16 and the high voltage device area 18. The isolation regions 20 in the low voltage device area 14 are not etched, or are etched less than the isolation regions 20 in the medium voltage device area 16 and the high voltage device area 18, as the sacrificial layer 26 has a greater thickness over the low voltage device area 14.

In the exemplary method, voids 112 are etched simultaneously, as opposed to the sequential etching of voids 52 and 72 in the method of FIGS. 3-11. Further processing of the partially fabricated integrated circuit 10 of FIG. 16 may be performed in accordance with the steps described in relation to FIGS. 9-11 to result in the partially fabricated integrated circuit of FIG. 17. Specifically, the medium voltage device area 16 and the high voltage device area 18 may be masked while regions of the low voltage device area 14 are selective masked and implanted to form doped regions 80 and 90. Processing of the integrated circuit 10 of FIG. 17 may then continue with formation of a gate dielectric layer as described in FIGS. 21-23.

Figure 18:
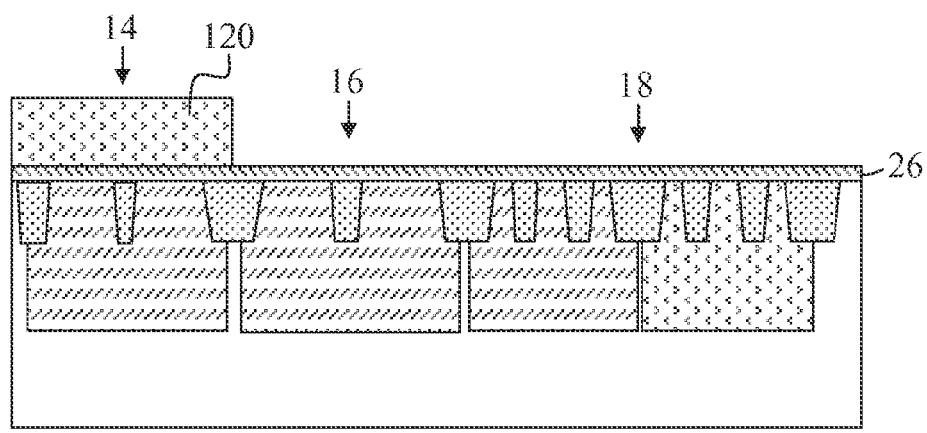
FIGS. 18-20 illustrate, in cross section, the low voltage device area, medium voltage device area and high voltage device area of the integrated circuit of FIGS. 1-2 and method steps for fabricating an integrated circuit in accordance with another embodiment herein.
Figure 19:
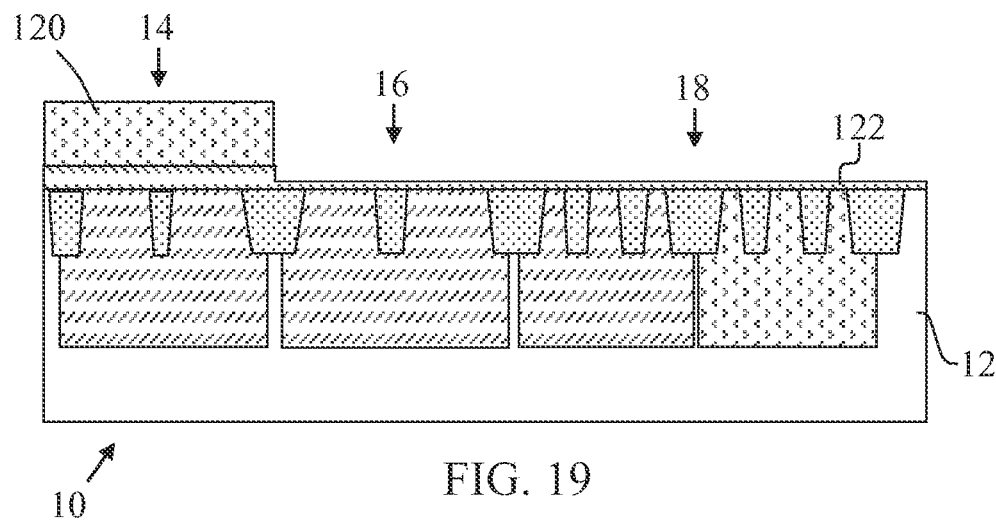
Figure 20:
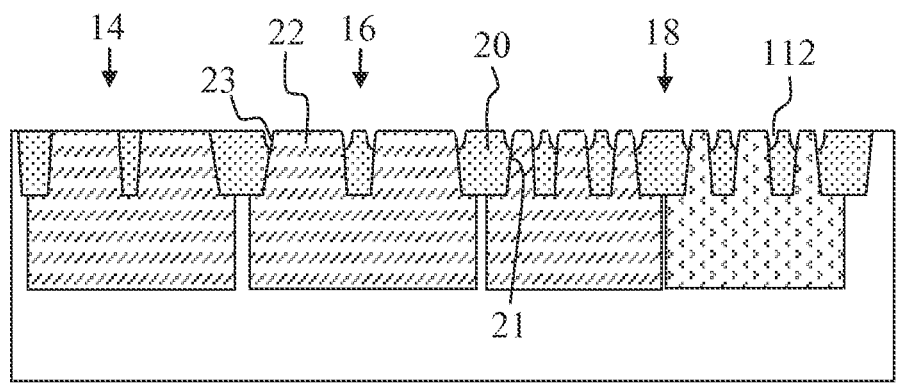

FIGS. 18-20 illustrate another embodiment for forming active regions 22 having exposed side surfaces 23 in the medium voltage device area 16 and the high voltage device area 18 of the integrated circuit 10. FIGS. 18-20 process the partially fabricated integrated circuit 10 of FIG. 2.

Similar to the embodiment of FIG. 12, in FIG. 18 the sacrificial layer 26 is not removed before the masking process for forming doped regions. In FIG. 18, mask 120 is formed and patterned over sacrificial layer 26 overlying the semiconductor substrate 12. As shown, the mask 120 covers the low voltage device area 14. Further, the mask 40 exposes the medium voltage device area 16 and the high voltage device area 18.

An etch process is performed around mask 120 in FIG. 19. As shown, the sacrificial layer 26 is etched to form a recessed portion 122 that is uninterrupted across the medium voltage device area 16 and the high voltage device area 18. An exemplary recessed portion 122 has a thickness of about 20 Å to about 50 Å. Mask 120 is removed, such as with a sulfuric acid and hydrogen peroxide mixture (SPM). A cap screen oxide layer is not needed as the sacrificial layer 26 remains completely covering the semiconductor substrate 12. In FIG. 20, an etch process is performed to remove the sacrificial layer 26. As shown, the etch process etches into the isolation regions 20 underlying the recessed portion 122 of the sacrificial layer 26, i.e., the isolation regions 20 in the medium voltage device area 16 and the high voltage device area 18. The isolation regions 20 in the low voltage device area 14 are not etched, or are etched less than the isolation regions 20 in the medium voltage device area 16 and the high voltage device area 18, as the sacrificial layer 26 has a greater thickness over the low voltage device area 14.

In the exemplary method of FIGS. 18-20, voids 112 are etched simultaneously, as opposed to the sequential etching of voids 52 and 72 in the method of FIGS. 3-11. Further processing of the partially fabricated integrated circuit 10 of FIG. 20 may be performed in accordance with the masking and implantation steps described in relation to FIGS. 4-11. Specifically, regions of the semiconductor substrate 12 may be selectively masked while unmasked regions are appropriately doped to form doped regions 50, 70, 80 and 90 in a partially fabricated integrated circuit 10 as shown in FIG. 11.

Figure 21:
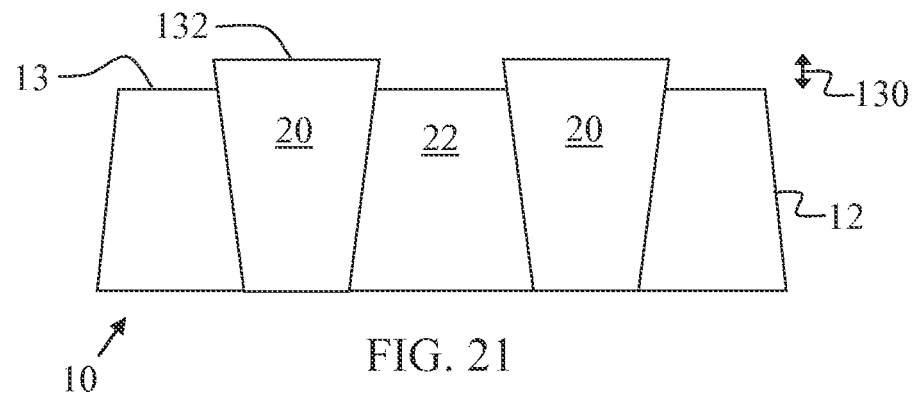
FIGS. 21-23 illustrate, in cross section, isolation regions and active regions processed according to the embodiments of FIG. 3-11, 12-17 or 18-20, and illustrate the further process of forming a gate dielectric layer over the active regions.
Figure 22:
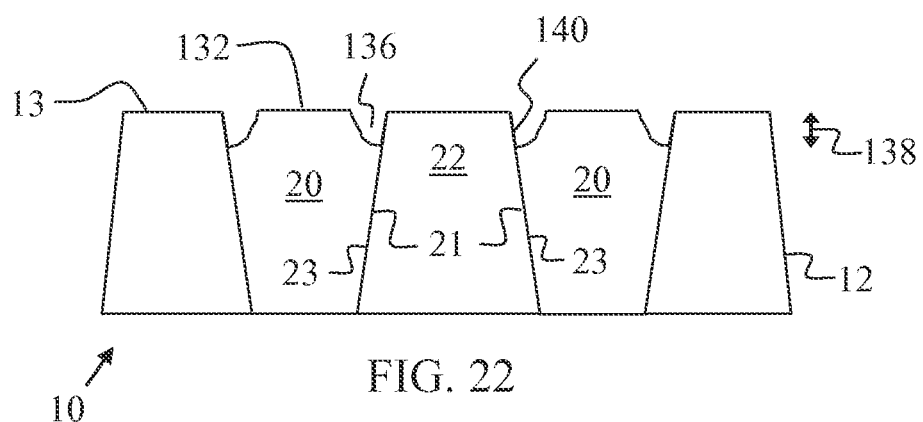
Figure 23:
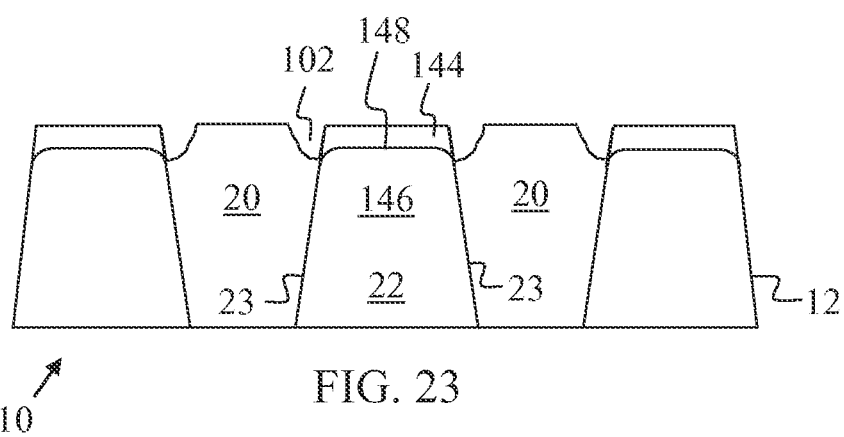

The three embodiments described above provide for an improved process to form a gate dielectric layer over active regions 22 in the medium voltage device area and the high voltage device areas. Referring to FIGS. 21-23, the formation of a dielectric layer in the active regions 22 of the medium voltage device area or high voltage device area is illustrated. In FIGS. 21-23 the gate dielectric layer is formed by an oxidation process as an oxide layer. Specifically, an exemplary process includes oxidizing the active regions 22 to form a gate oxide layer. However, other processes can be used to form other dielectric layers. FIG. 21 shows typical isolation regions 20 formed in the semiconductor substrate 12. Conventional processing uses a silicon nitride hardmask to form the isolation region 20. Removal of the silicon nitride hardmask results in a step height 130 between the upper surface 13 and the upper surface 132 of the isolation regions 20.

FIG. 22 illustrates the formation of voids 136 in the isolation regions 20. Voids 136 may be formed as voids 52, 72, and/or 112 according to one of the embodiment described above. During void formation in each embodiment, isolation regions 20 are etched along the upper surface 132 and along the side surfaces 21. As shown, the etch process reduces or eliminates the step height between the upper surface 13 of the semiconductor substrate 12 and the upper surface 132 of the isolation regions 20.

The voids 136 can be formed with a selected depth 138 based on the etch chemistry and processing conditions. The voids 136 expose portions 140 of the side surfaces 23 of the active regions 22. As the depth 138 of the voids 136 are selected, the length of the exposed portions 140 of the side surface 23 of the active regions 22 may be adjusted. In an exemplary embodiment, the depth 138 is from about 150 Å to about 200 Å.

Each of the three embodiments described above obtains the structure of the partially fabricated integrated circuit of FIG. 22. In FIG. 23, a process is performed to form a gate dielectric layer 144 over each active region 22. For example, an oxidation process is performed to form a gate oxide layer 144 over each active region 22. In an exemplary embodiment, a dual gate oxidation (DGO) process is used to form the gate oxide layer 144 in the medium voltage device area and the high voltage device areas. During the process the exposed surfaces of the active regions 22, e.g., the upper surfaces 132 and the portions 140 of the side surfaces 23, are contacted with oxygen. As a result, the gate oxide layer 144 is formed over underlying active material 146 in the active regions 22. As shown, the gate oxide layer 144 and the underlying active material 146 form a convex interface 148. That is, each interface 148 includes a greatest height at a central portion and slopes downwardly to the side surfaces 23 of the active region 22. As a result, the underlying active material 148 of the active regions 22 is provided with rounded upper corners.

After formation of the gate dielectric layer 144, additional processing, such as forming gate structures and well known final process steps, e.g., back end of line (BEOL) process steps, may be performed. It should be understood that various steps and structures may be utilized in further processing, and the subject matter described herein is not limited to any particular number, combination, or arrangement of steps or structures.

By selectively forming voids in isolation regions in medium and/or high voltage device areas of a semiconductor substrate, e.g., in thick gate dielectric device areas, formation of gate dielectric layers on active regions can be performed without the introduction of sharp corners to the active regions. For example, side surfaces of the active regions in medium and/or high voltage device areas are exposed for contact with oxidation atmosphere to inhibit sharp corner formation. The active regions are instead provided with a convex interface with the overlying gate oxide layer. As a result, gate performance may be improved.

To briefly summarize, the fabrication methods described herein result in integrated circuits with improved active regions. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   providing a semiconductor substrate having an upper surface and including active regions and isolation regions formed in a low voltage device area and in a high voltage device area, wherein the isolation regions are formed with an upper surface at a step height over the active regions, and wherein the isolation regions have sidewalls in contact with the active regions;
   selectively etching the upper surface of the isolation regions to reduce the step height and selectively etching the sidewalls of the isolation regions to form voids between the isolation regions and the active regions in the high voltage device area to expose active side surfaces; and
   oxidizing the upper surface and the active side surfaces to form a gate oxide layer over the low voltage device area and the high voltage device area.

2. The method of claim 1 wherein selectively etching the upper surface of the isolation regions to reduce the step height and selectively etching the sidewalls of the isolation regions to form voids between the isolation regions and the active regions in the high voltage device area comprises masking the low voltage device area while etching the high voltage device area.

3. The method of claim 1 wherein selectively etching the sidewalls of the isolation regions to form the voids comprises forming the voids with a void depth from about 150 Å to about 200 Å below the upper surface of the isolation region.

4. The method of claim 1 further comprising forming doped regions in the high voltage device area and forming doped regions in the low voltage device area, wherein:
   forming the doped regions in the high voltage device area comprises:
      forming a sacrificial layer over the high voltage device area and over the low voltage device area;
      forming a first mask over the sacrificial layer covering the low voltage device area and partially covering the high voltage device area to define first exposed portions of the high voltage device area;
      forming the doped regions in the first exposed portions;
      etching the first exposed portions of the high voltage device area, wherein etching the first exposed portions of the high voltage device area comprises selectively etching the upper surface of the isolation regions to reduce the step height and selectively etching the sidewalls of the isolation regions to form voids between the isolation regions and the active regions in the first exposed portions of the high voltage device area to expose active side surfaces;
      removing the first mask;
      forming a second mask covering the low voltage device area and partially covering the high voltage device area to define second exposed portions of the high voltage device area;
      forming the doped regions in the second exposed portions;
      etching the second exposed portions of the high voltage device area, wherein etching the second exposed portions of the high voltage device area comprises selectively etching the upper surface of the isolation regions to reduce the step height and selectively etching the sidewalls of the isolation regions to form voids between the isolation regions and the active regions in the second exposed portions of the high voltage device area to expose active side surfaces; and
      removing the second mask; and
   forming the doped regions in the low voltage device area comprises:
      forming a third mask partially covering the low voltage device area and covering the high voltage device area to define third exposed portions of the low voltage device area;
      forming the doped regions in the third exposed portions;
      removing the third mask;
      forming a fourth mask partially covering the low voltage device area and covering the high voltage device area to define fourth exposed portions of the low voltage device area;
      forming the doped regions in the fourth exposed portions; and
      removing the fourth mask.

5. The method of claim 1 wherein selectively etching the upper surface of the isolation regions to reduce the step height comprises eliminating the step height between the upper surface of the semiconductor substrate and the upper surface of the isolation regions.

6. The method of claim 1 wherein selectively etching the upper surface of the isolation regions to reduce the step height and selectively etching the sidewalls of the isolation regions to form voids between the isolation regions and the active regions in the high voltage device area to expose the active side surfaces comprises:
   forming a first mask covering the low voltage device area and partially covering the high voltage device area to define first exposed portions of the high voltage device area;
   etching first voids into the isolation regions in the first exposed portions;
   forming the doped regions in the first exposed portions;
   removing the first mask;
   forming a second mask covering the low voltage device area and partially covering the high voltage device area to define second exposed portions of the high voltage device area;
   forming the doped regions in the second exposed portions;
   etching second voids into the isolation regions in the second exposed portions; and
   removing the second mask.

7. The method of claim 1 wherein the upper surface of the semiconductor substrate in the active regions is not etched while selectively etching the upper surface of the isolation regions to reduce the step height and selectively etching the sidewalls of the isolation regions to form voids between the isolation regions and the active regions in the high voltage device area to expose active side surfaces.

8. The method of claim 1 wherein selectively etching the upper surface of the isolation regions to reduce the step height and selectively etching the sidewalls of the isolation regions to form voids between the isolation regions and the active regions in the high voltage device area to expose the active side surfaces comprises:
forming a first mask covering the low voltage device area and partially covering the high voltage device area to define first exposed portions of the high voltage device area;
etching first voids into the isolation regions in the first exposed portions;
removing the first mask;
forming a first cap screen oxide layer on the semiconductor substrate after removing the first mask; and
removing residue from the semiconductor substrate after forming the first cap screen oxide layer.

9. The method of claim 1 further comprising:
masking the high voltage device area; and
forming doped regions in the low voltage device area before oxidizing the upper surface and the active side surfaces to form the gate oxide layer over the low voltage device area and the high voltage device area.

10. The method of claim 1 further comprising forming a sacrificial layer overlying the semiconductor substrate, wherein selectively etching the upper surface of the isolation regions to reduce the step height and selectively etching the sidewalls of the isolation regions to form the voids between the isolation regions and the active regions in the high voltage device area to expose the active side surfaces comprises:
forming a first mask covering the low voltage device area and partially covering the high voltage device area to define first exposed portions of the high voltage device area;
etching into the sacrificial layer overlying the first exposed portions to form first recessed sacrificial layer portions;
removing the first mask;
forming a second mask covering the low voltage device area and partially covering the high voltage device area to define second exposed portions of the high voltage device area;
etching into the sacrificial layer overlying the second exposed portions to form second recessed sacrificial layer portions;
removing the second mask; and
performing an etch process to remove the sacrificial layer, wherein the etch process etches the voids into the isolations regions underlying the first recessed sacrificial layer portions and the second recessed sacrificial layer portions.

11. The method of claim 10 further comprising:
forming doped regions in the first exposed portions after forming the first mask;
forming doped regions in the second exposed portions after forming the second mask; and
selectively forming doped regions in the low voltage device area after removing the second mask.

12. The method of claim 1 further comprising forming a sacrificial layer overlying the semiconductor substrate, wherein selectively etching the upper surface of the isolation regions to reduce the step height and selectively etching the sidewalls of the isolation regions to form the voids between the isolation regions and the active regions in the high voltage device area to expose the active side surfaces comprises
forming a sacrificial layer mask over the sacrificial layer overlying the low voltage device area;
recessing the sacrificial layer to form a recessed sacrificial layer overlying the high voltage device area;
removing the sacrificial layer mask; and
performing an etch process to remove the sacrificial layer, wherein the etch process etches the voids into the isolations regions underlying the recessed sacrificial layer.

13. The method of claim 12 further comprising, after performing the etch process to remove the sacrificial layer and before forming the gate oxide layer over the low voltage device area and the high voltage device area:
forming a first mask covering the low voltage device area and partially covering the high voltage device area to define first exposed portions of the high voltage device area;
forming doped regions in the first exposed portions;
removing the first mask;
forming a second mask covering the low voltage device area and partially covering the high voltage device area to define second exposed portions of the high voltage device area;
forming doped regions in the second exposed portions;
removing the second mask; and
selectively forming doped regions in the low voltage device area.

14. A method for fabricating an integrated circuit, the method comprising:
providing a semiconductor substrate with a high voltage device area including an active region having an upper surface and an isolation region having an upper surface, wherein the isolation region has a sidewall in contact with a side surface of the active region;
simultaneously recessing the upper surface of the isolation region and etching the sidewall of the isolation region to form a void between the sidewall of the isolation region and the side surface of the active region; and
oxidizing the upper surface of the active region and the side surface of the active region in the high voltage device area to form oxidized material and to define a convex interface between the oxidized material and underlying active material in the active region in the high voltage device area.

15. The method of claim 14 wherein an etch process utilizing dilute hydrofluoric acid (DHF) is performed to simultaneously recess the upper surface of the isolation region and etch the sidewall of the isolation region to form the void.

16. The method of claim 14 wherein oxidizing the upper surface and the side surface of the active region in the high voltage device area comprises selectively oxidizing the upper surface of the active region to form an oxide layer, wherein the oxide layer is not formed on the isolation region.

17. The method of claim 14 wherein simultaneously recessing the upper surface of the isolation region and etching the sidewall of the isolation region to form the void between the sidewall of the isolation region and the side surface of the active region comprises forming the void with a bottom surface lower than the upper surface of the isolation region by a void depth of from about 150 Å to about 200 Å.

* * * * *